(12) United States Patent
Gillberg et al.

(10) Patent No.: US 9,745,947 B2
(45) Date of Patent: Aug. 29, 2017

(54) IGNITION CONTROL CIRCUIT WITH SHORT CIRCUIT PROTECTION

(71) Applicant: Fairchild Semiconductor Corporation, San Jose, CA (US)

(72) Inventors: James E. Gillberg, Flemington, NJ (US); Juergen Pianka, Bloomfield Twp, MI (US)

(73) Assignee: Fairchild Semiconductor Corporation, San Jose, CA (US)

( * ) Notice: Subject to any disclaimer, the term of this patent is extended or adjusted under 35 U.S.C. 154(b) by 20 days.

(21) Appl. No.: 14/449,932

(22) Filed: Aug. 1, 2014

(65) Prior Publication Data

US 2015/0041849 A1  Feb. 12, 2015

Related U.S. Application Data (60) Provisional application No. 61/863,526, filed on Aug. 8, 2013.

(51) Int. Cl.

| | |
|---|---|
| *H01L 29/66* | (2006.01) |
| *F02P 17/12* | (2006.01) |
| *H01L 27/02* | (2006.01) |
| *F02P 9/00* | (2006.01) |
| *F02P 3/04* | (2006.01) |

(52) U.S. Cl.
CPC ............... *F02P 17/12* (2013.01); *F02P 9/005* (2013.01); *H01L 27/0266* (2013.01); *H01L 27/0288* (2013.01); *F02P 3/0435* (2013.01)

(58) Field of Classification Search
CPC ............ H01L 27/0288; H01L 27/0266; H02M 3/158; F02P 17/12; F02P 3/0435

USPC .......................................................... 257/140
See application file for complete search history.

(56) References Cited

U.S. PATENT DOCUMENTS

| | | | | |
|---|---|---|---|---|
| 5,686,839 | A | * 11/1997 | Takagi | .................. B60L 3/0023 324/503 |
| 6,057,728 | A | * 5/2000 | Igarashi | ............. H03K 17/0828 327/427 |
| 2006/0244496 | A1 | * 11/2006 | Kawakita | ............... F02P 3/0552 327/110 |
| 2008/0180158 | A1 | * 7/2008 | Scollo | ................... H03K 17/567 327/432 |
| 2010/0263644 | A1 | * 10/2010 | Matsuda | ................. F02P 9/005 123/625 |

(Continued)

*Primary Examiner* — Duy T Nguyen
(74) *Attorney, Agent, or Firm* — Brake Hughes Bellermann LLP (57) ABSTRACT

In a general aspect, an apparatus can include an insulated-gate bipolar transistor device (IGBT), a gate driver circuit (driver) coupled with a gate terminal of the IGBT and a low-resistance switch device coupled between an emitter terminal of the IGBT and an electrical ground terminal, the low-resistance switch device being coupled with the electrical ground terminal via a resistor. The apparatus can also include a current sensing circuit coupled with the driver and a current sense signal line coupled with the current sensing circuit and a current sense node, the current sense node being disposed between the low-resistance switch device and the resistor. The apparatus can further include a control circuit configured, when the driver is off, to detect, based on a voltage on the current sense node, when a current through the resistor is above a threshold value and disable the IGBT in response to the detection.

22 Claims, 5 Drawing Sheets

(56) References Cited

U.S. PATENT DOCUMENTS

2013/0152910 A1\* 6/2013 Minoya .................... F02P 5/15
　　　　　　　　　　　　　　　　　　　　　123/625

\* cited by examiner

FIG. 5 a# IGNITION CONTROL CIRCUIT WITH SHORT CIRCUIT PROTECTION

RELATED APPLICATIONS

This application claims priority to and the benefit of, under 35 U.S.C. §119, U.S. Provisional Patent Application No. 61/863,526, filed Aug. 8, 2013, which is hereby incorporated by reference in its entirety.

TECHNICAL FIELD

This description relates to ignition control circuits. In particular, the description relates to short circuit protection in high-voltage ignition circuits, such as in automotive engine ignition systems.

BACKGROUND

Insulated-gate bipolar transistor (IGBT) devices are commonly used in high voltage applications, such as automotive ignition systems. For instance, IGBT devices may be used as coil drivers for automotive ignition control systems. In such applications, because IGBT devices have high input impedance, they may work/integrate well with Engine Control Module (ECM) integrated circuits (ICs), which are often implemented using complementary metal-oxide semiconductor processes.

IGBT devices implemented in automotive ignition systems generally operate at relatively high voltages (e.g., 400 V or more). Furthermore, such systems may operate in relatively harsh environments and, therefore, can be subject to failure as a result of these operating conditions (as well as other factors that may cause system failure). In some situations, failure of an IGBT in an automotive ignition system can cause catastrophic damage to elements of the system, and/or a vehicle in which the system is implemented. For instance, a shorted IGBT may overload a corresponding ignition coil. Such overloading of the coil may result in irreparable damage to the coil and could, in some instances, result in the ignition system causing an engine fire (e.g., due to the ignition coil combusting as a result of excessive current and associated heating in the ignition coil).

One approach to preventing such catastrophic failures (including the possibility of an engine fire) resulting from failure of an ignition control system (e.g., due to a shorted, or damaged IGBT) is to place a fuse between a battery terminal of the vehicle and one terminal of the primary winding of an ignition coil, where the other end of the primary winding is connected to a collector terminal of the IGBT (that operates as a coil driver). In such an arrangement, current in the fuse above a rated fuse value (e.g., as a result of such failure) will desirably cause the fuse to "open" or "blow" before catastrophic damage and/or a fire occurs.

Such approaches, however, have certain drawbacks. For example, fuses implemented in such systems can be slow to react and/or have unpredictable "open" points (e.g., a current and associated temperature at which the fuse "blows"). Such variation in a fuse's "open" point may be due to a number of factors, such as component packaging in which the fuse is housed, ambient operating conditions, and so forth, making it difficult to achieve precise fuse operation in the event of a failure in the system.

Also, if a fuse is slow to react, the goal of avoiding catastrophic damage may not be achieved. Furthermore, after such a failure (e.g., a blown fuse), the ignition control system will typically no longer function. Therefore, if the fuse blows as a result of a transient event, not a failure in the ignition control system, the vehicle may no longer function as desired (or at all) and need to be serviced.

SUMMARY

In a general aspect, an apparatus can include an insulated-gate bipolar transistor (IGBT) device, a gate driver circuit coupled with a gate terminal of the IGBT device and a low-resistance switch device coupled between an emitter terminal of the IGBT device and an electrical ground terminal, the low-resistance switch device being coupled with the electrical ground terminal via a resistor. The apparatus can also include a current sensing circuit coupled with the gate driver circuit and a current sense signal line coupled with the current sensing circuit and a current sense node, the current sense node being disposed between the low-resistance switch device and the resistor. The apparatus can still further include a control circuit that is configured, when the gate driver circuit is off, to detect, based on a voltage on the current sense node, when a current through the resistor is above a threshold value, and disable the IGBT device in response to the current through the resistor being above the threshold value.

In another general aspect, an apparatus can include an insulated-gate bipolar transistor (IGBT) device, a gate driver circuit coupled with a gate terminal of the IGBT device and a low-resistance switch device. The low-resistance switch device can have a first terminal coupled with an emitter terminal of the IGBT device and a second terminal coupled with an electrical ground terminal. The apparatus can also include a leakage detection circuit that is coupled with the emitter terminal of the IGBT and the first terminal of the low-resistance switch device. The leakage detection circuit can be configured, when the IGBT is off and the low-resistance switch device is open, to detect a first leakage current in the IGBT and detect a second leakage current in the low-resistance switch. The apparatus can also include a control circuit that, when the first leakage current is above a first threshold value or when the second leakage current is above a second threshold value, is configured to disable at least one of the IGBT device and the low-resistance switch.

In another general aspect, an apparatus can include an insulated-gate bipolar transistor (IGBT) device and a gate driver circuit coupled with a gate terminal of the IGBT device. The gate driver circuit can be configured to produce an ignition coil output signal triggering a spark in an engine in response to a spark control signal from an engine control module. The apparatus can further include a feedback circuit that is configured to identify failure of the IGBT device and produce a disable signal. The apparatus can still further include an IGBT disabling component that is configured to disable the IGBT device in response to the disable signal.

BRIEF DESCRIPTION OF THE DRAWINGS

Like reference symbols in the various drawings indicate like and/or similar elements.

DETAILED DESCRIPTION

Figure 1:
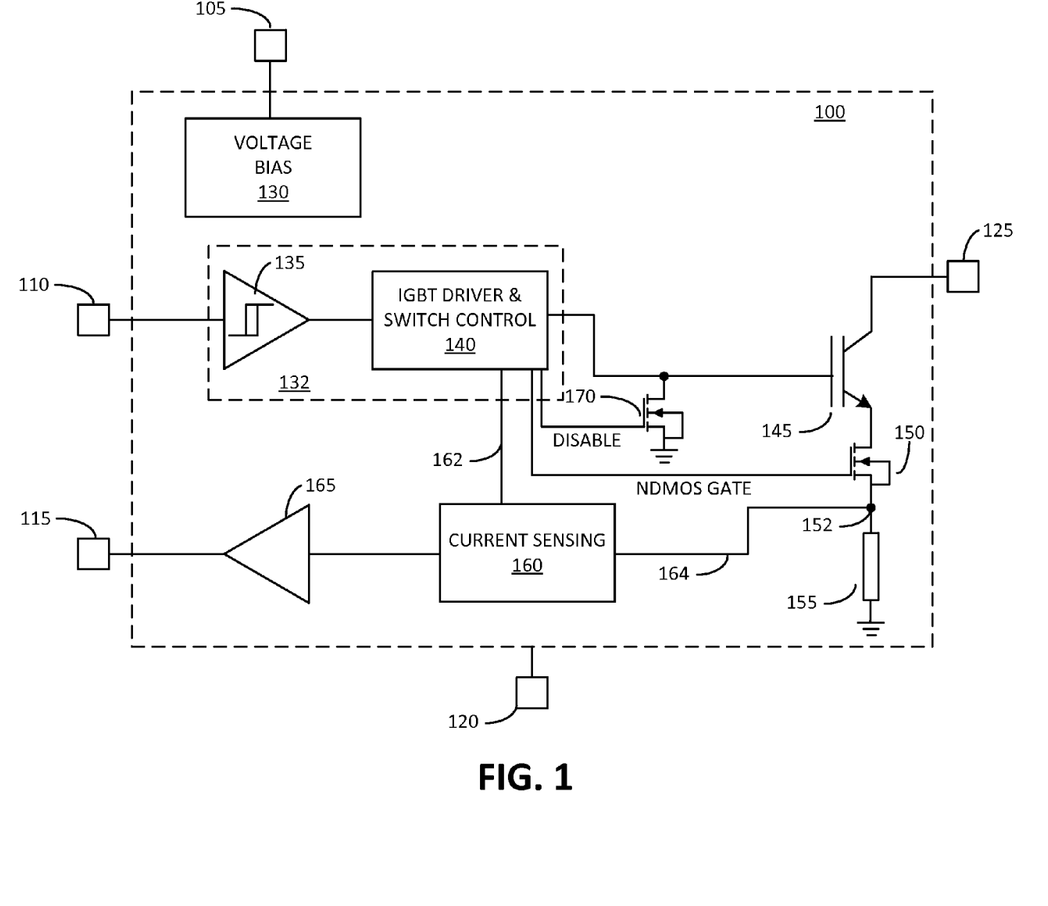
FIG. 1 is a block/schematic diagram of an ignition control circuit in accordance with an embodiment.

FIG. 1 is a block/schematic diagram illustrating an ignition control circuit 100 in accordance with an embodiment. The circuit 100 may be implemented as an alternative to, or in addition to, the use of a fuse to prevent catastrophic failure (such as thermal damage resulting from short circuits) of, for example, an automotive ignition system, or other coil driving circuits. For instance, the circuit 100 may be configured to detect failure of an IGBT in an ignition control system by detecting an amount of current that is conducted through the IGBT while the gate of the IGBT is turned off (and the IGBT is expected to be high-impedance). If this detected current is above a threshold value, the circuit 100 may determine that the IGBT has failed (or is about to fail) and, in response, may disable operation of the IGBT, such as using the approaches discussed herein. Disabling operation of the IGBT may include preventing current from flowing through the IGBT and, as a result, also preventing current from flowing through a corresponding primary winding of an ignition coil that is coupled with the (shorted or failing) IGBT.

Such approaches address at least some of the drawbacks of using a fuse to prevent catastrophic damage from such failures. For instance, as compared with implementations that use only a fuse for short-circuit protection, the approaches described herein for detecting failure (e.g., of an IGBT) in an ignition control circuit are more precise, have more predictable timing, and are relatively much faster (e.g., microseconds as compared to milliseconds, or longer). Also, the approaches describe herein may be relatively inexpensive as compared to implementing a high current fuse (e.g., with a rating of 20-25 A in some implementations).

As shown in FIG. 1, the circuit 100 may include five signal terminals, a vehicle battery terminal 105, a spark control signal input terminal 110, a flag signal output terminal 115, a ground terminal 120 and a collector terminal 125. The circuit 100 can be implemented in a number of ways. For instance, the circuit 100 can be implemented as a monolithic semiconductor device, or by a combination of discrete devices, logic circuits, programmable-logic, firmware and/or software. The connection between the elements of the circuit 100 may be referred to as wires or lines.

When the circuit 100 is implemented in an ignition control system, a primary winding of an ignition coil (not shown) may be coupled between the vehicle battery terminal 105 and the collector terminal 125. Also, in some embodiments, a fuse (not shown) may be coupled, in series, between the vehicle battery terminal 105 and the primary winding of the ignition coil as a secondary protection mechanism.

In the circuit 100, the vehicle battery terminal 105 may also be coupled with a voltage bias circuit 130. In an example embodiment, the voltage bias circuit 130 may include a voltage regulation circuit and a bandgap device that provides a voltage reference for the voltage bias circuit 130. In other embodiments, other approaches for implementing the voltage bias circuit 130 may be used. While the connections are not specifically shown in FIG. 1, the voltage bias circuit 130 may be coupled with, and provide power to the various elements of the circuit 100, such as the gate driver circuit, the current sensing circuit 160, and so forth. Likewise, the ground terminal 120 may be used to provide electrical ground to the various elements of the circuit 100, such as those electrical grounds illustrated in FIG. 1 (though the specific connections are not shown).

As an example, during operation of the circuit 100, the spark control signal input terminal 110 may receive a spark control signal from an Engine Control Module (ECM) (not shown). The spark control signal may be used by the circuit 100 to control charging/discharging of an ignition coil (e.g., by turning an IGBT 145 on and off), in order to initiate a spark (in a spark plug) for igniting fuel mixture in a cylinder chamber of a vehicle engine.

For example, during normal operation of the circuit 100, a spark control signal (from the ECM) may be communicated (e.g., transmitted) to a gate driver circuit 132 that includes an input buffer 135 and an IGBT driver and switch control circuit 140 (which can include a gate driver circuit and a control circuit that can be integrated together or can be separated into separate circuits). The input buffer 135 (which may be implemented using hysteresis, as is shown in FIG. 1) may then communicate the spark control signal to an IGBT driver and switch control circuit 140. The IGBT driver the switch control circuit 140 may then (in normal operation) communicate the spark control signal to a gate terminal of the IGBT 145. Based on the spark control signal received at the gate terminal of the IGBT 145, the IGBT 145 will control charging and discharging of a primary winding of an ignition coil in order to initiate a spark in a spark plug that is coupled with a secondary winding of the ignition coil.

As shown in FIG. 1, the circuit 100 may also include a low-resistance switch 150 (which does not significantly affect the voltage drop across the IGBT) and a low-resistance value resistor 155 (which does not significantly affect the voltage drop across the IGBT) that are included in the current path between the IGBT 145 and electrical ground. Using the techniques described herein, the switch 150 and the resistor 155 may be used to detect failure of the IGBT 145 (e.g., a shorted IGBT 145) and, also, to disable current flow through the IGBT 145 (and a corresponding ignition coil) in response to detecting such a failure. Depending on the particular embodiment, the resistor 155 may be a precision resistor or, in other implementations, may be a bond wire that is used to establish an electrical ground connection (e.g., with the ground terminal 120).

In the particular embodiment shown in FIG. 1, the switch 150 may take the form of an n-type double-diffused metal-oxide semiconductor transistor (NDMOS). In other embodiments, the switch 150 may be implemented using other types of low-resistance switch devices. In the circuit 100, because the majority of the collector voltage would be dropped across the IGBT 145 (e.g., which may be operated in a linear mode), the switch 150 may be a relatively low voltage device as compared to the IGBT 145. For example, the IGBT 145 may be capable of operation with collector voltages of 400 V or more, while the switch 150 may be capable of operating with a (drain) voltage in the range of 40 V or lower.

In the circuit 100, a current sensing circuit (block) 160 may sense current through the IGBT 145 during normal operation of the circuit 100, which may be done by sensing a voltage across the resistor 155 on a current sense node 152 via a current sense signal line 164. The current sensing circuit 160 may also provide a flag signal (via the signal buffer 165 and the flag signal output terminal 115) to the ECM when the current through the IGBT 145 reaches a given value. In this implementation, the flag signal may indicate to the ECM that the ignition coil is sufficiently charged to initiate a spark. In response to receiving the flag signal from the circuit 100, the ECM may change a state of the spark control signal (e.g., from high to low) in order to cause the primary winding of the ignition coil to discharge though its secondary winding (e.g., by turning off the IGBT 145). This discharge may then initiate a spark in a spark plug that is coupled with the secondary winding of the ignition coil. Further, in certain implementations, the IGBT driver and switch control circuit 140 may be configured to filter noise from the spark control signal, detect when the ECM is providing a spark control signal that has a duration longer than an upper duration limit (e.g., the ECM is malfunctioning), among other operations, such as performing soft-shutdown of the ignition coil.

In the event of a failure (e.g., a short or damage in the IGBT 145), the IGBT driver and switch control 140 in the circuit 100 may also be configured to detect (based on a current feedback signal via signal line 162 from the current sensing circuit 160) such failure of the IGBT 145, and to, in response, disable operation of the IGBT 145 (e.g., by grounding its input) and/or prevent current flow through the IGBT 145 (e.g., by turning off the switch 150). The current feedback signal may indicate a current determined by the current sensing circuit 160 via the current sense signal line 164 and the current sense node 152. In certain embodiments, the functionality of the current sensing circuit 160 and the functionality of the IGBT driver and switch control circuit 140 may be implemented in a single circuit, or may be distributed across a larger number of circuits.

In such situations, the IGBT driver and switch control circuit 140 may disable operation of the IGBT 145 in a number of ways. For example, the IGBT driver and switch control circuit 140 may provide a disable signal (at logic "1") on a DISABLE signal line in FIG. 1. The disable signal (on the DISABLE signal line) may be applied to a switch 170 (e.g., a gate terminal of an NDMOS). In response to the disable signal, the switch 170 may couple the gate terminal of the IGBT 145 to ground, regardless of the state of the spark control signal provided by the ECM. In other implementations, the disable signal may be used to couple the spark control signal input terminal 110 to ground in a similar manner as shown for the gate terminal of the IGBT 145 (by the switch 170) in FIG. 1.

Also in the circuit 100, the IGBT driver and switch control circuit 140 may apply a signal (logic "0") on an NDMOS GATE signal line that shuts off the switch 150, opening the current path between the IGBT electrical ground (e.g., via the ground terminal 120) and preventing current from flowing through the IGBT 145. As a result, current would also be prevented from flowing through the primary winding of the ignition coil coupled with the collector terminal 125 of the circuit 100, thus preventing catastrophic damage. The signals applied on the DISABLE signal line and/or the NDMOS GATE signal line to disable operation of the IGBT 145 and/or prevent current flow through the IGBT 145 may be latched until, for example, a reset signal is received by the circuit 100 from the ECM. Such an approach allows for the circuit 100 to recover from a transient event that causes the IGBT 145 to be disabled (e.g., without an actual physical failure in the circuit 100). In other embodiments, other techniques for disabling the IGBT 145 and/or preventing current from flowing in the IGBT 145 may be used, such as those described herein.

Figure 2A:
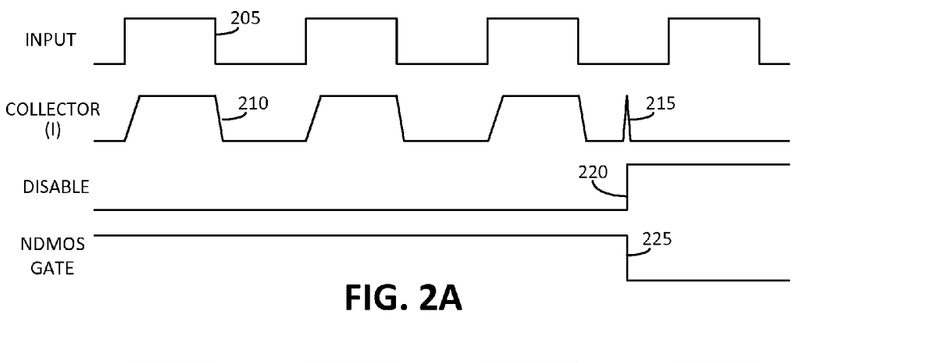
FIGS. 2A-2C are timing diagrams illustrating operation of the ignition control circuit of FIG. 1.
Figure 2B:
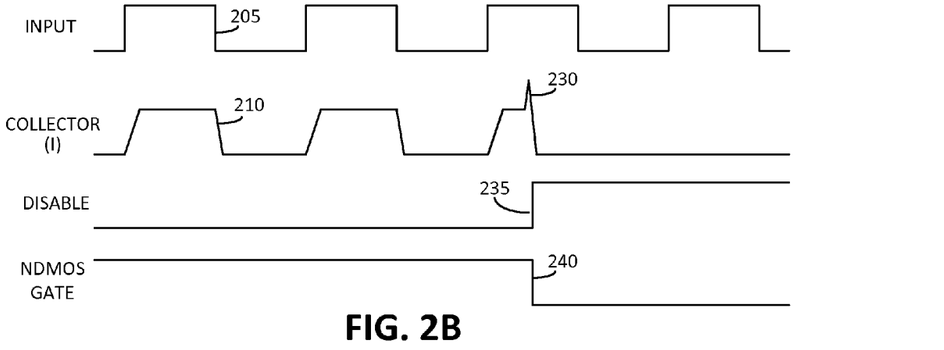
Figure 2C:
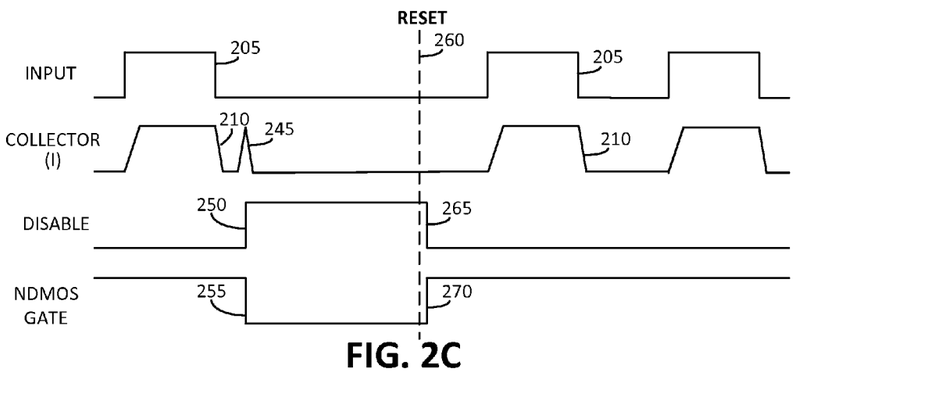

Referring now to FIGS. 2A-2C, timing diagrams are illustrated that demonstrate the operation of the circuit 100 shown in FIG. 1 in accordance with an embodiment. However, depending on the particular implementation, the circuit 100 may operate in other ways, or may have other timing relationships. Furthermore, the timing relationships shown in FIGS. 2A-2C may also be implemented by other ignition control circuits, such as, for example, the circuit shown in FIG. 3 and discussed below. For purposes of discussion and illustration, the timing diagrams shown in FIGS. 2A-2C will be described with further reference to FIG. 1.

In each of the timing diagrams illustrated in FIGS. 2A-2C, timing relationships for four signals are shown. The signals illustrated include a spark control signal (labeled INPUT), current through the IGBT 145 (labeled COLLECTOR (I)), a disable signal on the DISABLE signal line and an NDMOS GATE signal that is applied on the gate terminal of the switch 150. In each of the FIGS. 2A-2C, the signal pulses 205 of INPUT and the signal pulses 210 of COLLECTOR (I) indicate normal operation of the circuit 100. In the timing diagrams of FIGS. 2A-2C, current COLLECTOR (I) may be determined based on a voltage across the resistor 155.

As shown in FIGS. 2A-2C, during normal operation (e.g., in conjunction with the pulses 205 and 210), DISABLE is logic "0" and NDMOS GATE is logic "1" (e.g., the IGBT 145 being enabled and able to conduct current). Specifically, each signal pulse 205 shows INPUT transitioning from logic "0" to logic "1" and, as a result, current in the IGBT 145 (represented by COLLECTOR (I)) linearly increasing. When the signal pulse 205 transitions back to logic "0" (e.g., in response to a flag signal), the current in the IGBT 145 drops to zero (or near zero) (which may correspond with discharge of the primary winding through a secondary winding to initiate a spark). That sequence, illustrating normal operation of the circuit 100, is the same in each of FIGS. 2A-2C and will not be described in detail for those (normal operation) time periods with respect to each of the timing diagrams illustrated in FIGS. 2A-2C.

Referring specifically to FIG. 2A, the current pulse 215 of COLLECTOR (I) occurs when INPUT is logic "0" and the IGBT 145 should be off (high impedance). Accordingly, the current pulse 215 (which indicates that current is flowing in the IGBT 145) may indicate damage, and/or a short in the IGBT 145. As described herein, the current pulse 215 may be detected by the current sensing circuit 160 (e.g., based on a voltage across the resistor 155).

The current sensing circuit 160 may provide an indication of this current to the IGBT driver and switch control circuit 140. Once it is determined by the current sensing circuit 160 and/or the IGBT driver and switch control circuit 140 that the current represented by the current pulse 215 exceeds a threshold value, the IGBT driver and switch control circuit 140 may be configured, as shown in FIG. 2A, to change DISABLE from logic "0" to logic "1" at 220 (e.g., to ground the gate terminal of the IGBT 145) and change NDMOS GATE from logic "1" to logic "0" at 225 (e.g., to open the switch 150 and prevent current from flowing through the IGBT 145). In this example, INPUT continues to change states after the current pulse 215. However, because the IGBT 145 is disabled (e.g., its gate terminal is grounded), COLLECTOR (I) remains at zero (or near zero). However, in other embodiments, INPUT may also be disabled and remain at logic "0" after the current pulse 215 is detected.

In the timing diagram shown in FIG. 2B, the current pulse 230 in COLLECTOR (I) occurs when INPUT is logic "1" and the IGBT 145 is conducting current (as shown by COLLECTOR (I)). The current pulse 230 in FIG. 2B, however, is above a second threshold value (that is higher than the threshold value discussed with respect to FIG. 2A). Accordingly, the current pulse 230 may also indicate damage, and/or a short in the IGBT 145 (that may have occurred while the IGBT 145 was conducting). As previously discussed, the current pulse 230 may be detected by the current sensing circuit 160 (e.g., based on a voltage across the resistor 155).

The current sensing circuit 160 may provide an indication of the current pulse 230 (above the second threshold) to the IGBT driver and switch control circuit 140. Once it is determined by the current sensing circuit 160 and/or the IGBT driver and switch control circuit 140 that the current represented by the current pulse 230 exceeds the second (higher) threshold value, the IGBT driver and switch control circuit 140 may be configured to change DISABLE from logic "0" to logic "1" at 235 (e.g., to ground the gate terminal of the IGBT 145) and change NDMOS GATE from logic "1" to logic "0" at 240 (e.g., to open the switch 150 and prevent current from flowing through the IGBT 145). In this example, INPUT continues to change states after the current pulse 230. However, because the IGBT 145 is disabled, COLLECTOR (I) remains at zero (or near zero). As with the example discussed with respect to FIG. 2A, in other implementations, INPUT may also be disabled and remain at logic "0" after the current pulse 230 is detected.

The timing diagram shown in FIG. 2C illustrates how the circuit 110 can return to normal operation after detecting a transient event that result in the IGBT 145 being disabled. In timing relationship of FIG. 2C, the current pulse 245 in COLLECTOR (I) occurs when INPUT is logic "0" and the IGBT 145 should be off (high impedance). Accordingly, the current pulse 245 may be detected by the current sensing circuit 160 (e.g., based on a voltage across the resistor 155) and compared to the lower threshold value (e.g., 0.5-1 amps in an example implementation).

The current sensing circuit 160 may provide an indication of the current pulse 245 to the IGBT driver and switch control circuit 140. Once it is determined by the current sensing circuit 160 and/or the IGBT driver and switch control circuit 140 that the current represented by the current pulse 245 (which, in this example, is the result of a transient event) exceeds the lower threshold value (e.g., because INPUT is logic "0"), the IGBT driver and switch control circuit 140 may change DISABLE from logic "0" to logic "1" at 250 (e.g., to ground the gate terminal of the IGBT 145) and change NDMOS GATE from logic "1" to logic "0" 255 (e.g., to open the switch 150 and prevent current from flowing through the IGBT 145). In this example, INPUT is also held at logic "0" after the pulse 245 is detected.

In this example, a RESET (e.g., a power-on reset) may occur and 260 and, in response, DISABLE may return to logic "0" at 265 and NDMOS GATE may return to logic "1" at 270, which will re-enable the IGBT 145 (shut off the switch 170) and allow the IGBT 145 to conduct current again (e.g., turn on the switch 150). The RESET at 260 may also re-enable INPUT. In this example, because the current pulse 245 was the result of a transient event, not a short and/or damage in the IGBT 145, the circuit 100, as shown in FIG. 1, may resume normal operation (e.g., with signal pulses 205 and 210) after the occurrence of the RESET 260. If a fuse between the battery and the ignition coil had been blown in response the current pulse 245, the circuit 100 would no longer operate as the ignition coil would be electrically decoupled from the vehicle battery.

Figure 3:
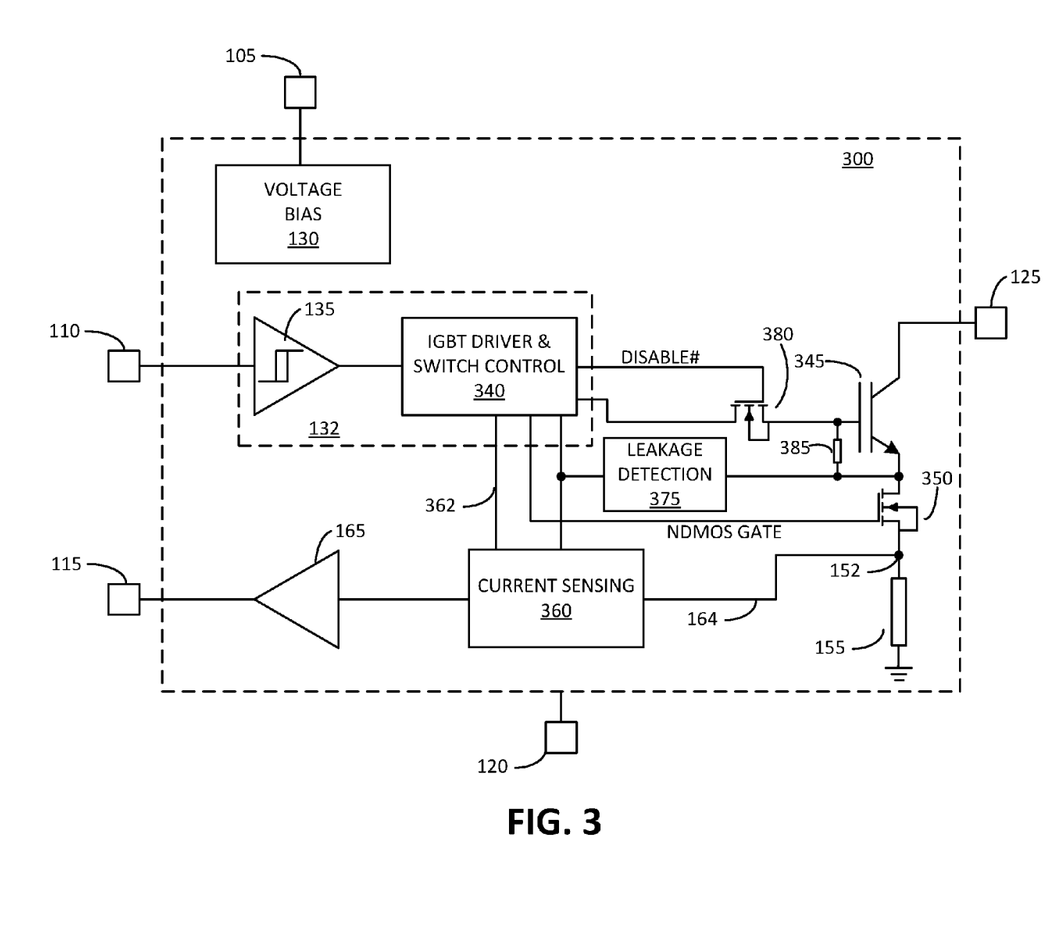
FIG. 3 is a block/schematic diagram of another ignition control circuit in accordance with an embodiment.

FIG. 3 is a block/schematic diagram illustrating another ignition control circuit 300 in accordance with an embodiment. As with the circuit 100, the circuit 300 may be implemented as an alternative to, or in addition to, the use of a fuse to prevent catastrophic failure of an automotive ignition system. The circuit 300 is similar to the circuit 100 in a number of respects. Accordingly, for purposes of illustration, in FIG. 3, like elements of the circuit 300 with those of the circuit 100 are referenced with the 100 series reference numbers of FIG. 1. Further, for purposes of brevity and clarity, the specific details of those like elements are not discussed again with respect to FIG. 3. Also, in certain embodiments, the approaches and techniques discussed above with respect to the circuit 100 of FIG. 1 and the timing relationships shown in FIGS. 2A-2C may be similarly applied to the circuit 300.

In comparison with the circuit 100, the circuit 300 includes a leakage detection circuit 375. As shown in FIG. 3, the leakage detection circuit 375 may be coupled with a node between an emitter terminal of the IGBT 345 and a drain terminal of the switch (NDMOS) 350, as well as with the IGBT driver and switch control 340 (which can include a gate driver circuit and a control circuit that can be integrated together or can be separated into separate circuits) and the current sensing circuit 360. In an example implementation, the leakage detection circuit 375 may include a pull-up device (e.g., a first current source) and a pull-down device (e.g., a second current source), which may each be separately turned on.

Figure 4:
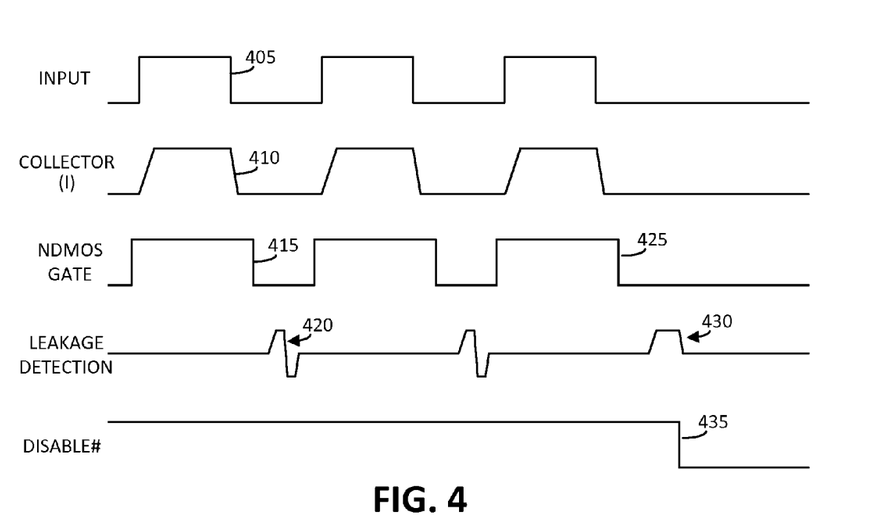
FIG. 4 is a timing diagram illustrating operation of the ignition control circuit of FIG. 3.

As is discussed in further detail with respect to FIG. 4, the leakage detection circuit 375 may be used to check for shorts and/or damage in the IGBT 345 and the switch 350 (e.g., using the current sensing circuit 360 in conjunction with the leakage detection circuit 375, such as by measuring a voltage and or current. In other implementations, either the current sensing circuit 160 or the leakage detection circuit 375 may be used independently to detect shorts and/or damage in the IGBT 345 and the switch 350. In certain embodiments, the functionality of the current sensing circuit 360, the functionality of the leakage detection circuit 375 and the functionality of the IGBT driver and switch control circuit 340 may be implemented in a single circuit, or may be distributed across a larger number of circuits.

Also in comparison with the circuit 100, the circuit 300 includes a switch 380 (an NDMOS device) in place of the switch 170 in FIG. 1 and a gate discharge resistor 385. The switch 380 is coupled in series with the IGBT driver and switch control 340 and a gate terminal of the IGBT 345. Further in the circuit 300, a gate terminal of the switch (NDMOS) 380 is coupled with a DISABLE# signal. The DISABLE# signal of FIG. 3, when logic "0", may disable the IGBT 345 by decoupling the gate of the IGBT 345 from the IGBT driver and switch control 340 and the resistor 385 would discharge the gate of the IGBT 345. In other embodiments, the switch 170 of FIG. 1 and the switch 380 of FIG. 3 may both be implemented in an ignition control circuit, such as the circuits 100 and 300 where the switch 170 is controlled by DISABLE and the switch 380 is controlled by DISABLE#. In still other implementations, other approaches may be used to disable the IGBT 345.

FIG. 4 is a timing diagram that illustrates operation of the circuit 300 using the leakage detection circuit 375 to detect failure (e.g., shorts and/or damage) of the IGBT 345 and/or the switch 350. In the timing diagram illustrated in FIG. 4, five signals are illustrated. Of course, other timing relationships may apply to the circuit 300 (such as those in FIGS. 2A-2C) and the timing relationships in FIG. 4 may apply to other ignition control circuits.

As with the timing diagrams in FIGS. 2A-2C, the signals illustrated in FIG. 4 include a spark control signal (labeled INPUT), current through the IGBT 345 (labeled COLLECTOR (I)) and an NDMOS GATE signal that is applied on the gate terminal of the switch 150. Further, the signals illustrated in FIG. 4 include a LEAKAGE DETECTION signal that illustrates operation of the leakage detection circuit 375 and a DISABLE# signal (in place DISABLE) that is used to control a gate of the switch (NDMOS) 380.

Similar to the timing diagrams in FIGS. 2A-2C, the single pulses 405 and 410 illustrate normal operation of the circuit 300. In contrast with the timing diagrams illustrated in FIGS. 2A-2C, the timing diagram of FIG. 4 illustrates that NDMOS GATE transitions from logic "1" to logic "0" at 415, after the collector current shown by COLLECTOR (I) in the signal pulse 410 returns to zero (or near zero) (e.g., to initiate spark). As shown by the signal pulse 420 in FIG. 4, while the INPUT, COLLECTOR (I) and NDMOS GATE signals are low (e.g., logic "0" or zero current), the leakage detection circuit 375 may first activate its pull-up device and then its pull-down device. The signal pulse 420 of LEAKAGE DETECTION indicates normal operation of the circuit 300 (e.g., the node between the emitter terminal of the IGBT 345 and the drain terminal of the switch (NDMOS) 350 can be pulled up and down, indicating high impedance in both directions). In other embodiments, the pull-up and pull-down devices may be activated in the opposite order.

In the timing diagram of FIG. 4, the signal pulse 430 illustrates a situation where damage may be present in IGBT 345 (e.g., the node between the IGBT and the switch 350 cannot be pulled down when the IGBT 345 and switch 350 are off). In this situation the current sensing circuit 360 may detect that the leakage detection circuit 375 is unable to pull the node between the IGBT 345 and the switch 350 to ground, indicating that the IGBT 345 may be damaged and/or shorted.

The current sensing circuit 360 may communicate this information to the IGBT driver and switch control 340. In response the IGBT driver and switch control 340 may transition DISABLE# from logic "1" to logic "0" at 435, may hold NDMOS GATE at logic "0" and may disable INPUT, as shown in FIG. 4. This would decouple the gate of the IGBT 345 from the IGBT driver and switch control 340, open the current path between IGBT and the ground terminal and eliminate the input signal from being transmitted out of the IGBT driver and switch control 340. In other implementations, only a subset of these actions may occur in order to disable the IGBT 345 and prevent it from conducting current. Damage to the switch 350 may be similarly detected by the leakage detection circuit 375 being unable to pull-up the node between the IGBT 345 and the switch 350.

Figure 5:
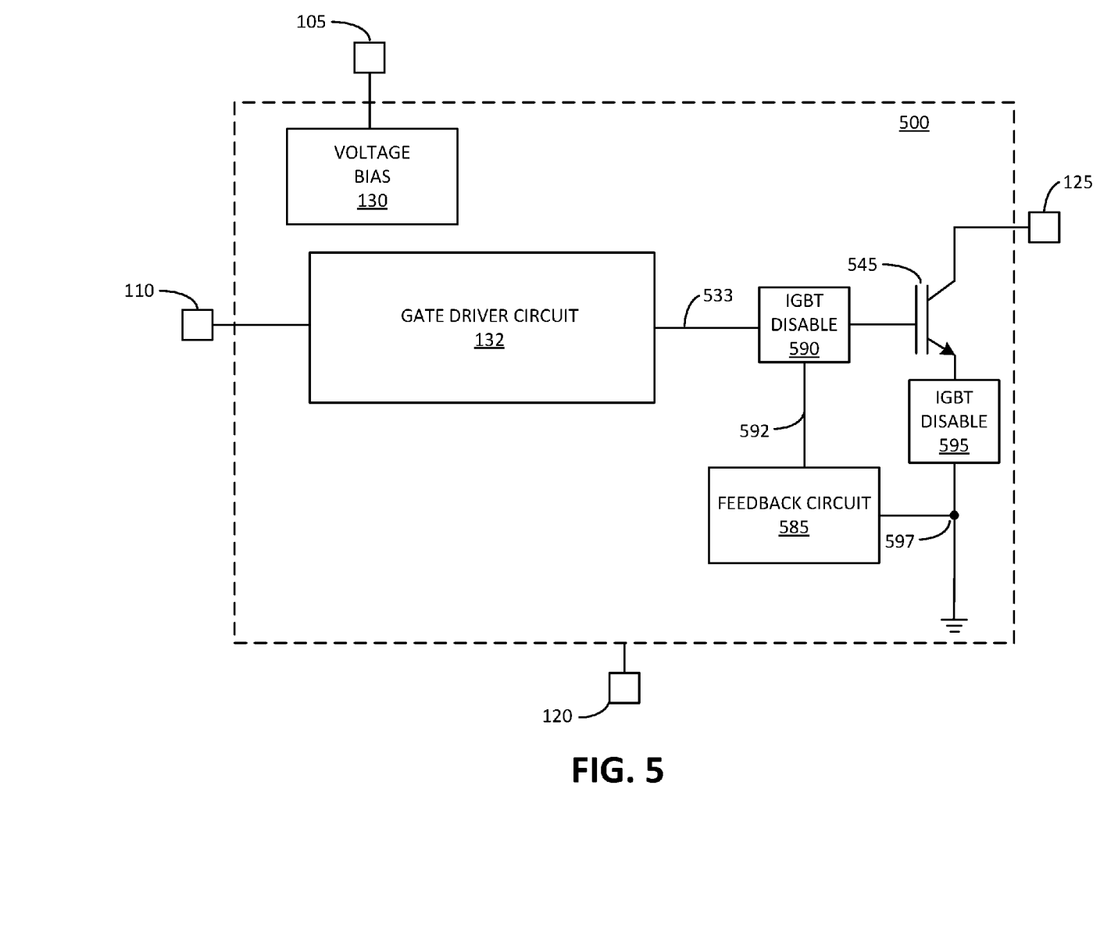
FIG. 5 is a block/schematic diagram of yet another ignition control circuit in accordance with an embodiment.

FIG. 5 is a block/schematic diagram illustrating a circuit 500 in accordance with an embodiment. As with the circuits 100 and 300, the circuit 500 may be, for example, implemented as in an automotive ignition system, or in other coil driver circuits. The circuit 500 is similar to the circuits 100 and 300 in a number of respects. Accordingly, for purposes of illustration, in FIG. 5, like elements of the circuit 500 with those of the circuits 100 and 300 are referenced with the 100 series reference numbers of FIG. 1. Further, for purposes of brevity and clarity, the specific details of those like elements are not discussed again with respect to FIG. 5. Also, in certain embodiments, the approaches and techniques discussed above with respect to the circuit 100 of FIG. 1 and the circuit 300 of FIG. 3, as well as the timing relationships shown in FIGS. 2A-2C and 4 may be similarly applied to the circuit 500.

In comparison with the circuits 100 and 300, the circuit 500 includes a feedback circuit 585 that is coupled with a first IGBT disable component 590 and a second IGBT disable component 595. The feedback circuit 585 is also coupled with a sense node 597. In this implementation, the feedback circuit 585 may be configured to identify a failure mode of the IGBT device 545. For example, the feedback circuit 585 may identify a failure mode of the IGBT device 545 based on a voltage and/or a current at the sense node 597, such as when the IGBT device 545 is supposed to be off (high impedance). The feedback circuit 585 may be further configured, in response to identifying a failure mode of the IGBT device 545, to produce a disable signal.

In the circuit 500, the feedback circuit 585 may provide the disable signal to the first IGBT disable component 590 and/or to the second IGBT disable component 595 (via the signal line 592). In other embodiments, the feedback circuit 585 may provide a feedback signal to the IGBT driver and switch control circuit 540. If the feedback signal indicates failure of the IGBT 545, the IGBT driver and switch control circuit 540 may then provide a disable signal to one, or both of the IGBT disable components 590, 595. In other implementations, only one of the IGBT disable components 590, 595 may be used. In still other implementations, separate disable signals could be used for each of the IGBT disable components 590, 595.

In the circuit 500, the disable signal may cause the IGBT disable component 590 and/or the IGBT disable component 595 to disable operation of the IGBT device 545 (e.g., by grounding the gate terminal using the IGBT disable component 590 and/or opening a current path from the IGBT device 545 using the IGBT disable component 595). As noted above, in other implementation, only one of the IGBT disable components 590, 595 may be used.

In one general aspect, an apparatus can include an insulated-gate bipolar transistor (IGBT) device, and a gate driver circuit coupled with a gate terminal of the IGBT device. The apparatus can include a low-resistance switch device coupled between an emitter terminal of the IGBT device and an electrical ground terminal where the low-resistance switch device is coupled with the electrical ground terminal via a resistor. The apparatus can include a current sensing circuit coupled with the gate driver circuit, and a current sense signal line coupled with the current sensing circuit and a current sense node. The current sense node can be disposed between the low-resistance switch device and the resistor. The apparatus can include a control circuit configured, when the gate driver circuit is off, to detect, based on a voltage on the current sense node, when a current through the resistor is above a threshold value, and disable the IGBT device in response to the current through the resistor being above the threshold value.

In some implementations, the threshold value is a first threshold value, and the current sensing circuit can be further configured, when the gate driver circuit is on, to detect, based on the voltage on the current sense node, when the current through the resistor is above a second threshold value; and disable the IGBT device in response to the current through the resistor being above the second threshold value.

In some implementations, the disabling the IGBT device can include latching a disable signal. The disable signal can cause the gate terminal of the IGBT device to be coupled to the electrical ground terminal. In some implementations, the disabling the IGBT device can include latching a disable signal. The disable signal can cause an input signal of the gate driver circuit to be coupled to the electrical ground terminal.

In some implementations, the disabling the IGBT device includes latching a disable signal. The disable signal can cause an output signal of the gate driver circuit to be coupled to the electrical ground terminal. In some implementations, the disabling the IGBT device includes latching a disable signal. The disable signal can cause the gate driver circuit to be decoupled from the gate terminal of the IGBT device.

In some implementations, the disabling the IGBT device can include latching a disable signal. The disable signal can cause the low-resistance switch to open. In some implementations, the resistor can include a bond wire. In some implementations, the resistor can include a precision resistor. In some implementations, the low-resistance switch is a metal-oxide semiconductor (MOS) transistor.

In another general aspect, the apparatus can include an insulated-gate bipolar transistor (IGBT) device, and a gate driver circuit coupled with a gate terminal of the IGBT device. The apparatus can include a low-resistance switch device having a first terminal coupled with an emitter terminal of the IGBT device and a second terminal coupled with an electrical ground terminal. The apparatus can include a leakage detection circuit coupled with the emitter terminal of the IGBT and the first terminal of the low-resistance switch device. The leakage detection circuit can be configured, when the IGBT is off and the low-resistance switch device is open, to detect a first leakage current in the IGBT, and detect a second leakage current in the low-resistance switch. The apparatus can include a control circuit that, when the first leakage current is above a first threshold value or when the second leakage current is above a second threshold value, can be configured to disable at least one of the IGBT device and the low-resistance switch.

In some implementations, the disabling the IGBT device includes latching a disable signal. The disable signal can cause the gate terminal of the IGBT device to be coupled to the electrical ground terminal. In some implementations, the disabling the IGBT device includes latching a disable signal. The disable signal can cause an input signal of the gate driver circuit to be coupled to the electrical ground terminal.

In some implementations, the disabling the IGBT device includes latching a disable signal. The disable signal can cause an output signal of the gate driver circuit to be coupled to the electrical ground terminal. In some implementations, the disabling the IGBT device includes latching a disable signal. The disable signal can cause the gate driver circuit to be decoupled from the gate terminal of the IGBT device.

In some implementations, the disabling the IGBT device includes latching a disable signal. The disable signal can cause the low-resistance switch to open. In some implementations, the low-resistance switch includes an n-type double-diffused metal-oxide-semiconductor (NDMOS) transistor.

In yet another general aspect, an apparatus can include an insulated-gate bipolar transistor (IGBT) device, and a gate driver circuit coupled with a gate terminal of the IGBT device and configured to produce an ignition coil output signal triggering a spark in an engine in response to a spark control signal from an engine control module. The apparatus can include a feedback circuit configured to identify failure of the IGBT device and produce a disable signal. The apparatus can include an IGBT disabling component configured to disable the IGBT device in response to the disable signal.

In some implementations, the IGBT disabling component is configured to couple a gate terminal of the IGBT with electrical ground. In some implementations, the IGBT disabling component is configured to open a current path between an emitter terminal of the IGBT and electrical ground.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Galium Nitride (GaN), Silicon Carbide (SiC), and/or so forth.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
   an insulated-gate bipolar transistor (IGBT) device;
   a gate driver circuit having an input terminal and an output terminal, the input terminal being configured to receive, from an engine control module, a spark control signal, the output terminal being coupled with a gate terminal of the IGBT device, the gate driver circuit being configured to produce, at the output terminal, an ignition coil output signal triggering a spark in an engine in response to the spark control signal;
   an IGBT disabling component including a switch device, the switch device being directly coupled to the IGBT device; and
   a feedback circuit directly coupled with at least one of the gate driver circuit or the IGBT disabling component, the feedback circuit being configured to control the IGBT disabling component, the feedback circuit being further configured to identify failure of the IGBT device and, in response, produce a disable signal,
   the IGBT disabling component configured to disable the IGBT device in response to the disable signal.

2. The apparatus of claim 1, wherein:
the IGBT disabling component includes a low-resistance switch device coupled between an emitter terminal of the IGBT device and an electrical ground terminal, the low-resistance switch device being coupled with the electrical ground terminal via a resistor; and
the feedback circuit includes:
a current sensing circuit coupled with the gate driver circuit;
a current sense signal line coupled with the current sensing circuit and a current sense node, the current sense node being disposed between the low-resistance switch device and the resistor; and
a control circuit configured, when the gate driver circuit is off, to:
detect, based on a voltage on the current sense node, when a current through the resistor is above a threshold value; and
provide the disable signal to disable the IGBT device in response to the current through the resistor being above the threshold value.

3. The apparatus of claim 2, wherein the threshold value is a first threshold value, the current sensing circuit being further configured, when the gate driver circuit is on, to:
detect, based on the voltage on the current sense node, when the current through the resistor is above a second threshold value; and
disable the IGBT device in response to the current through the resistor being above the second threshold value.

4. The apparatus of claim 2, wherein disabling the IGBT device includes latching a disable signal, the disable signal causing the low-resistance switch to open.

5. The apparatus of claim 2, wherein the resistor comprises a bond wire.

6. The apparatus of claim 2, wherein the resistor comprises a precision resistor.

7. The apparatus of claim 2, wherein the low-resistance switch is a metal-oxide semiconductor (MOS) transistor.

8. The apparatus of claim 1, wherein:
the IGBT disabling component includes a low-resistance switch device coupled between a gate terminal of the IGBT device and an electrical ground terminal; and
disabling the IGBT device includes latching a disable signal, the disable signal causing the gate terminal of the IGBT device to be coupled to the electrical ground terminal.

9. The apparatus of claim 1, wherein disabling the IGBT device includes latching a disable signal, the disable signal causing an input signal of the gate driver circuit to be coupled to an electrical ground terminal.

10. The apparatus of claim 1, wherein disabling the IGBT device includes latching a disable signal, the disable signal causing an output signal of the gate driver circuit to be coupled to an electrical ground terminal.

11. The apparatus of claim 1, wherein disabling the IGBT device includes latching a disable signal, the disable signal causing the gate driver circuit to be decoupled from the gate terminal of the IGBT device.

12. The apparatus of claim 1, wherein:
the IGBT disabling component includes a low-resistance switch device having a first terminal coupled with an emitter terminal of the IGBT device and a second terminal coupled with an electrical ground terminal; and
the feedback circuit includes:
a leakage detection circuit coupled with the emitter terminal of the IGBT device and the first terminal of the low-resistance switch device, the leakage detection circuit being configured, when the IGBT device is off and the low-resistance switch device is open, to:
detect a first leakage current in the IGBT device; and
detect a second leakage current in the low-resistance switch; and
a control circuit that, when the first leakage current is above a first threshold value, or when the second leakage current is above a second threshold value, is configured to perform at least one of:
providing the disable signal to disable the IGBT device; and
disabling the low-resistance switch.

13. The apparatus of claim 12, wherein disabling the IGBT device includes latching a disable signal, the disable signal causing the gate terminal of the IGBT device to be coupled to the electrical ground terminal.

14. The apparatus of claim 12, wherein disabling the IGBT device includes latching a disable signal, the disable signal causing an input signal of the gate driver circuit to be coupled to the electrical ground terminal.

15. The apparatus of claim 12, wherein disabling the IGBT device includes latching a disable signal, the disable signal causing an output signal of the gate driver circuit to be coupled to the electrical ground terminal.

16. The apparatus of claim 12, wherein disabling the IGBT device includes latching a disable signal, the disable signal causing the gate driver circuit to be decoupled from the gate terminal of the IGBT device.

17. The apparatus of claim 12, wherein disabling the IGBT device includes latching a disable signal, the disable signal causing the low-resistance switch to open.

18. The apparatus of claim 12, wherein the low-resistance switch includes an n-type double-diffused metal-oxide-semiconductor (NDMOS) transistor.

19. The apparatus of claim 1, wherein the IGBT disabling component is configured to couple a gate terminal of the IGBT device with electrical ground.

20. The apparatus of claim 1, wherein the IGBT disabling component is configured to open a current path between an emitter terminal of the IGBT device and electrical ground.

21. The apparatus of claim 1, wherein the feedback circuit includes a leakage detection circuit.

22. The apparatus of claim 1, wherein the feedback circuit includes a current sensing circuit.

* * * * *